United States Patent
Chang et al.

(10) Patent No.: US 8,093,928 B2
(45) Date of Patent: Jan. 10, 2012

(54) SIGNAL SOURCE DEVICES

(75) Inventors: Chih Wei Chang, Taipei (TW); Yi-Jan Chen, Taipei (TW)

(73) Assignees: Mediatek Inc., Hsin-Chu (TW); National Taiwan University, Taipei (TW)

(*) Notice: Subject to any disclaimer, the term of this patent is extended or adjusted under 35 U.S.C. 154(b) by 382 days.

(21) Appl. No.: 12/395,851

(22) Filed: Mar. 2, 2009

(65) Prior Publication Data

US 2010/0219873 A1   Sep. 2, 2010

(51) Int. Cl.
*H03K 27/00* (2006.01)
(52) U.S. Cl. ............. 327/115; 327/117; 377/47; 331/57
(58) Field of Classification Search .................. 327/115, 327/117; 377/47; 331/57, 177 V, 47, 50, 331/51, 55
See application file for complete search history.

(56) References Cited

U.S. PATENT DOCUMENTS

| | | | | |
|---|---|---|---|---|
| 3,973,139 A | * | 8/1976 | Dingwall | 377/105 |
| 4,369,379 A | * | 1/1983 | Hull | 377/28 |
| 5,485,110 A | * | 1/1996 | Jones et al. | 327/99 |
| 6,297,681 B1 | * | 10/2001 | Wang | 327/281 |
| 2008/0068053 A1 | | 3/2008 | Shimada | |

FOREIGN PATENT DOCUMENTS

| CN | 1426627 | | 6/2003 |
|---|---|---|---|
| JP | 58051625 A | * | 3/1983 |

OTHER PUBLICATIONS

English language translation of abstract of CN 1426627 (published Jun. 25, 2003).

* cited by examiner

*Primary Examiner* — Ryan Johnson
(74) *Attorney, Agent, or Firm* — Thomas|Kayden

(57) ABSTRACT

A signal source device is provided and includes a plurality of latch units, an inverter unit, and a voltage-shifting unit, which may include a capacitance unit. The plurality of latch units are substantially cascaded. The inverter unit is coupled to the latch units. The voltage-shifting unit has a first terminal coupled to the inverter unit and one of the latch units and a second terminal receiving a first input signal, for shifting a voltage level at the first terminal according to the first input signal.

20 Claims, 10 Drawing Sheets

SIGNAL SOURCE DEVICES

BACKGROUND OF THE INVENTION

1. Field of the Invention

The invention relates to a signal source device, and more particularly to a signal source device applied in a transceiver.

2. Description of the Related Art

The global system for mobile communications (GSM) is the most widely used cellular phone system. Phase noise is an important specification for a 900-MHz GSM signal source device of a transmitter (TX) in a GSM transceiver. Particularly, because the phase noise of the signal source device at 20 MHz offset will interfere with the receiving band of a receiver (RX), the phase noise of the signal source device is strictly restricted. According to GSM specifications, the phase noise of the local oscillator (LO) at 20 MHz is restrained below −162 dBc/Hz. GSM transceiver designs have been developed toward single CMOS chip solutions. However, for the latest CMOS technology, there are some problems which include: low quality on-chip inductors, lossy Si substrate, and increased 1/f noise accompanying with the channel scale-down. The problems seriously affect the phase noise of the signal source device, such that there are no assurances, that the phase noise of the signal source device at 20 MHz offset will always be below −162 dBc/Hz.

Thus, it is desired to provide a signal source device which provides an output signal with low phase noise. Especially, when the provided signal source device is applied in a GSM transceiver, and the output signal conforms to GSM specifications.

BRIEF SUMMARY OF THE INVENTION

An exemplary embodiment of a signal source device comprises a plurality of latch units, an inverter unit, and a voltage-shifting unit. The plurality of latch units are configured in a substantially cascaded fashion. The inverter unit is coupled to the latch units. The voltage-shifting unit has a first terminal coupled to the inverter unit and one of the latch units and a second terminal receiving a first input signal, for shifting a voltage level at the first terminal according to the first input signal.

Another exemplary embodiment of a signal source device for generating an output signal comprises an oscillator and a first divider. The oscillator generates a first oscillating signal and a second oscillating signal forming a differential pair. The first divider receives the first and second oscillating signals and generates a first divided signal. The first divider comprises a plurality of latch units, an inverter unit, and a voltage-shifting unit. The plurality of latch units are configured in a substantially cascaded fashion, and each latch unit receives the first oscillating signal and the second oscillating signal. The inverter unit is coupled to the latch units and outputs the first divided signal. The voltage-shifting unit has a first terminal coupled to the inverter unit and one of the latch units and a second terminal receiving the first oscillating signal, for shifting a voltage level at the first terminal according to the first oscillating signal. The output signal corresponds to the first divided signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
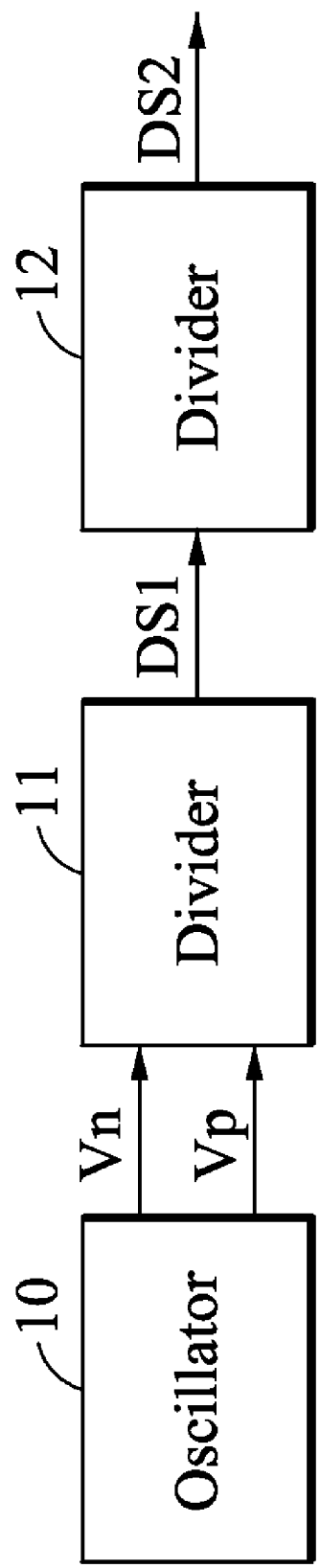
FIG. 1 is a schematic view showing a signal source device in a 900 MHz GSM transceiver.

FIG. 1 is a schematic view showing a signal source device capable of implementing in a 900 MHz GSM transceiver. Referring to FIG. 1, a signal source device 1 comprises an oscillator 10 and dividers 11 and 12. The oscillator 10 generates two oscillating signals Vn and Vp with 3.6 GHz, which form a differential pair. The divider 11 receives the oscillating signals Vn and Vp and generates a divided signal DS1 with 1.8 GHz. The divider 12 then receives the divided signal DS1 and generates a divided signal DS2 with 900 MHz. Thus, the signal source device 1 generates an output signal Sout with 900 MHz. Because the oscillating frequency of the oscillator 10 is four times higher than the desired frequency 900 MHz, the inductance of the LC tank in the oscillator 10 can be four times smaller than that in an oscillator oscillating at 900 MHz, and higher inductor quality can be achieved. In addition, the phase noise of the signal source device 1 can be improved due to the dividers 11 and 12. This characteristic is derived from the following Lesson's phase noise model:

$$L\{\Delta\omega\} \propto 20\log\left(\frac{\omega_0}{2Q_L\Delta\omega}\right). \qquad \text{equation (1)}$$

As can be seen, the signal phase noise $L\{\Delta\omega\}$ reduces 6 dB when the oscillating frequency $w_o$ is divided by 2.

Please note that the signal source device 1 is not limited to generate a 900 MHz signal; in other words, the oscillating frequency of the oscillator 10 is not limited to be 3.6 GHz, and the frequency-dividing factors of the dividers 11 and 12 are not necessary to be two. Moreover, in another embodiment, the signal source device 1 may comprise only one divider or more than two dividers, with proper frequency-dividing factors.

Figure 2:
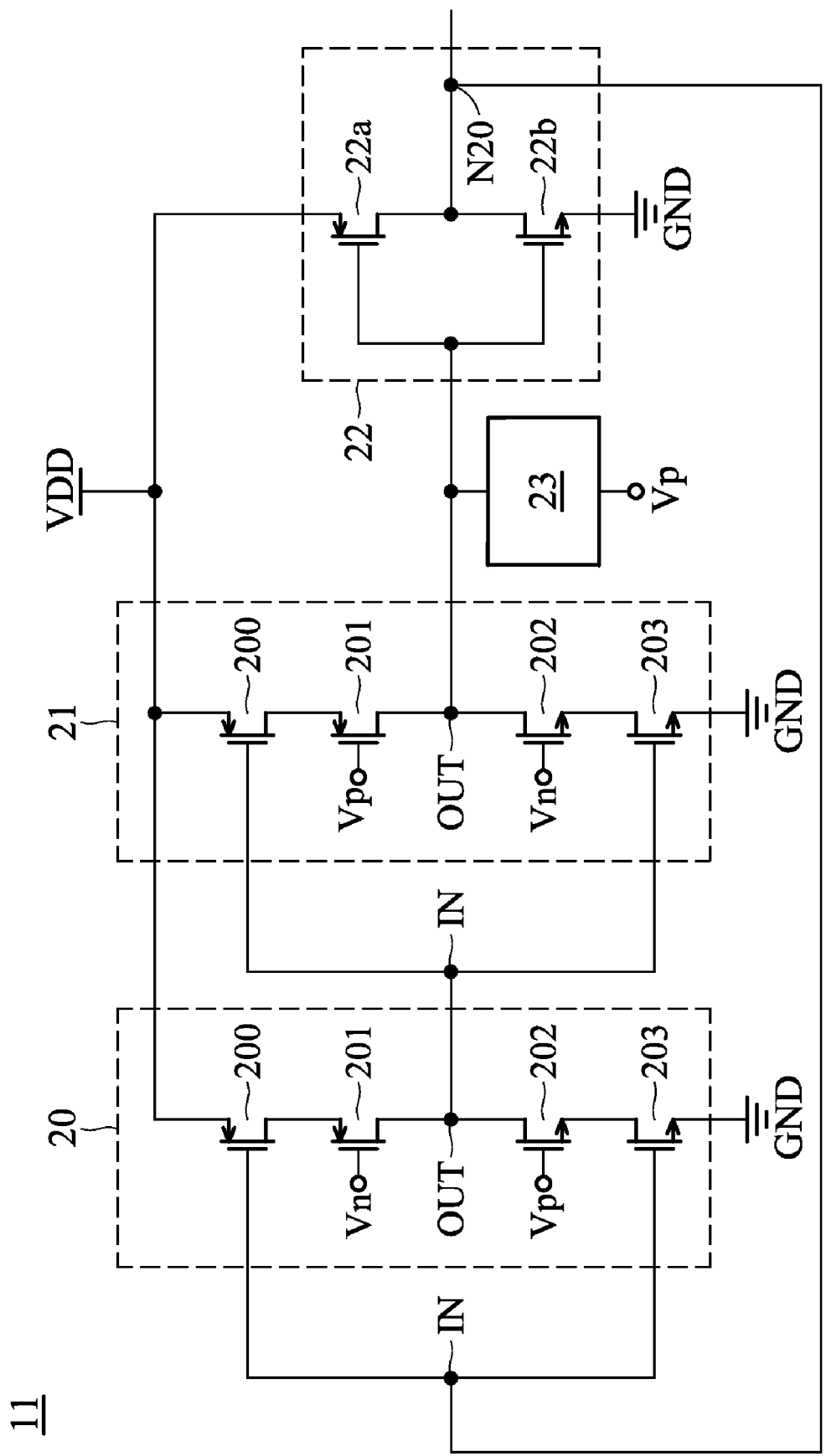
FIG. 2 shows an exemplary embodiment of a divider.

FIG. 2 shows an exemplary embodiment of the divider 11. Referring to FIG. 2, the divider 11 comprises two-stage latch units 20 and 21, an inverter unit 22, and a voltage-shifting unit 23. The latch units 20 and 21 are substantially cascaded, and each of them receives the oscillating signal Vn and the oscillating signal Vp. Each of the latch units 20 and 21 comprises transistors 200, 201, 202, and 203 which are coupled in series between a supply voltage source VDD (for example 1.2V in the embodiment) and a ground GND. In the embodiment of FIG. 2, the transistors 200 and 201 are P-type metal oxide semiconductor (PMOS) transistors, while the transistors 202 and 203 are NMOS transistors. A source terminal of the PMOS transistor 200 is coupled to the supply voltage source VDD, and a gate terminal (control terminal) thereof is coupled to an input terminal IN. A source terminal of the PMOS transistor 201 is coupled to a drain terminal of the PMOS transistor 200, and a drain thereof is coupled to an output terminal OUT. A drain terminal of the NMOS transistor 202 is coupled to the drain terminal of the PMOS transistor 201 at the output terminal OUT. A drain terminal of the NMOS transistor 203 is coupled to a source terminal of the NMOS transistor 202, a source terminal thereof is coupled to the ground GND, and a gate terminal (control terminal) thereof receives the input terminal IN. Note that the gate terminal of the PMOS transistor 201 and the gate terminal of the NMOS transistor 202 in the first-stage latch unit 20 respectively receive the oscillating signal Vn and the oscillating signal Vp, while the gate terminal of the PMOS transistor 201 and the gate terminal of the NMOS transistor 202 in the last-stage latch unit 21 respectively receive the oscillating signal Vp and the oscillating signal Vn. The inverter unit 22 is coupled to the output terminal OUT of the latch unit 21 and comprises two transistors 22a and 22b which are coupled together at the node N20. The inverter unit 22 outputs the divided signal DS1 at the node N20. The voltage-shifting unit 23 has a first terminal coupled to the inverter unit 22 and the output terminal OUT of the latch unit 21 (the last stage among the latch units 20 and 21) and a second terminal receiving the oscillating signal Vp, for shifting the voltage level at the first terminal (i.e. the output terminal OUT of the latch unit 21) according to the oscillating signal Vp. Referring to FIG. 2, the input terminal IN of the latch unit 20 is coupled to the node N20 for receiving the divided signal DS1, and the output terminal OUT thereof is coupled to the input terminal IN of the latch unit 21.

Without the voltage-shifting unit 23 coupled to the inverter unit 22 and the output terminal OUT of the latch unit 21, when the oscillating signal Vp is at a high level and the oscillating signal Vn is at a low level, the PMOS transistor 201 and the NMOS transistor 202 of the latch unit 21 are turned off, and voltage Vout at the output terminal OUT of the latch unit 21 is floating and has a high level close to VDD (1.2V). Returning to the embodiment of FIG. 2, the voltage-shifting unit 23 is coupled to the inverter unit 22 and the output terminal OUT of the latch unit 21, and the oscillating signals Vp and Vn are signals with large signal swing. A high level of each of the oscillating signals Vn and Vp is larger than VDD in this embodiment, such as 2.2V. When the oscillating signal Vp is at a high level while the oscillating signal Vn is at a low level, the PMOS transistor 201 and the NMOS transistor 202 of the latch unit 21 are turned off, and the voltage Vout of the latch unit 21 is raised to be over 1.2V (VDD) as the oscillating signal Vp is raised to the high level. The raised voltage Vout of the latch unit 21 increases the amplitude of the divided signal DS1. According to equation (2), when the voltage Vout of the latch unit 21 is raised, signal phase noise L{Δw} of the divider 11 is lowered. Thus, for the signal source device 1, phase noise is improved due to the lowered phase noise of the divider 11.

$$L\{\Delta w\} \propto 10\log \frac{v_{noise}^2}{Vout^2} \quad \text{equation (2)}$$

Figure 3:
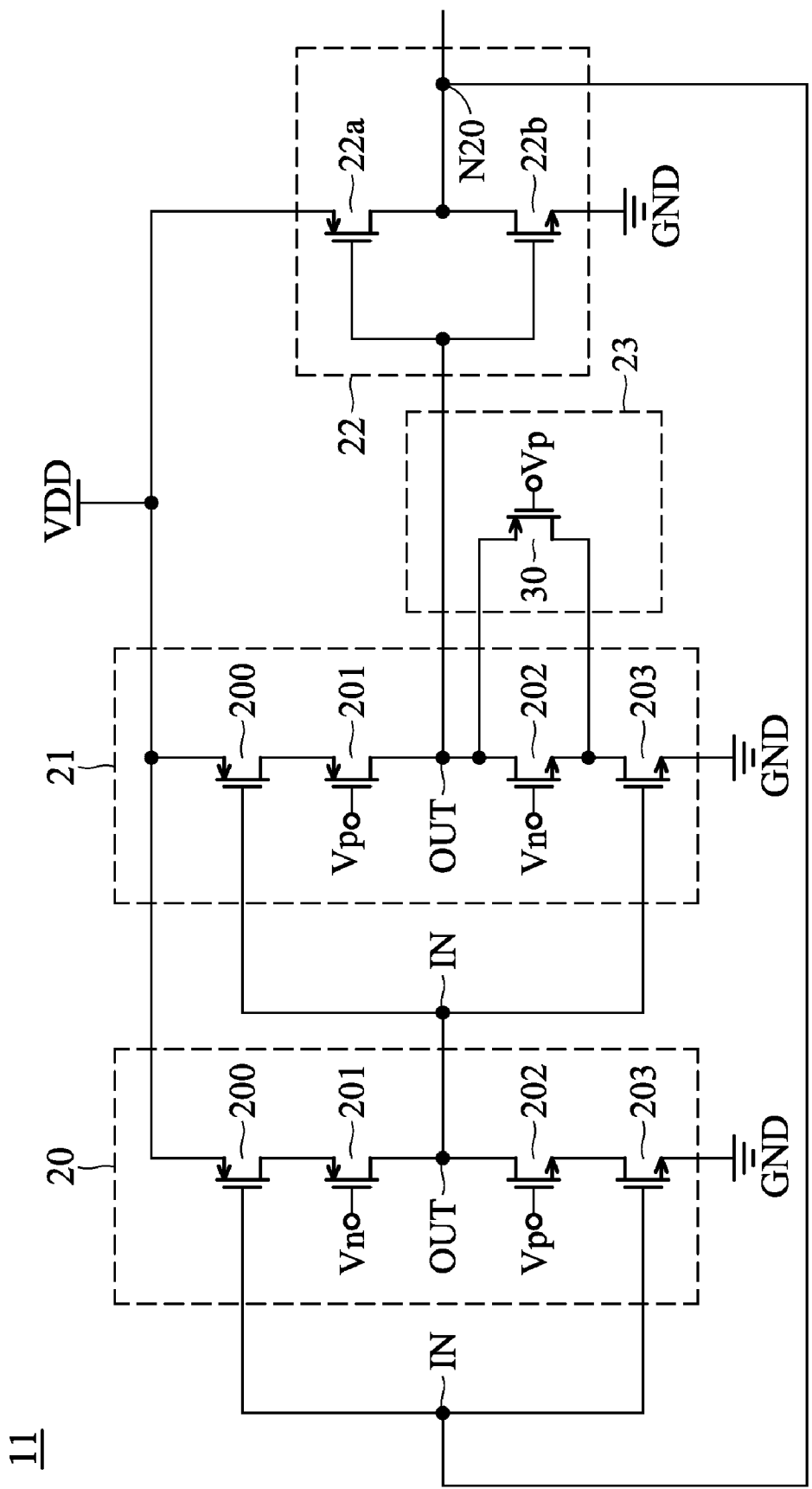
FIG. 3 shows an exemplary embodiment of a capacitance unit of the divider in FIG. 2.

In one embodiment, the voltage-shifting unit 23 comprises a capacitance unit. Since the voltage drop of a capacitance unit will not instantaneously change, the voltage level at one terminal of the capacitance unit will follow the voltage variation at another terminal of the capacitance unit, thereby accomplishing the voltage-shifting function. FIG. 3 shows an exemplary embodiment of the capacitance unit 23. Referring to FIG. 3, the capacitance unit 23 comprises a PMOS transistor 30. A source terminal of the PMOS transistor 30 is coupled to the inverter unit 22 and the output terminal OUT of the latch unit 21, a drain terminal thereof is coupled to the source of the NMOS transistor 202, and a gate terminal thereof receives the oscillating signal Vp. When the oscillating signal Vp is at the high level while the input signal Vn is at the low level, the PMOS transistor 201 and the NMOS transistor 202 of the latch unit 21 are turned off, and the voltage Vout of the latch unit 21 is charged through the parasitic gate-to-source capacitance (Vgs) of the PMOS transistor 30 to be over 1.2V (VDD) due to feed-through effect. As described above, the signal phase noise L{Δw} of the divider 11 is lowered as the voltage Vout of the latch unit 21 is raised. Thus, for the signal source device 1, phase noise is improved due to the lowered phase noise of the divider 11.

Figure 4:
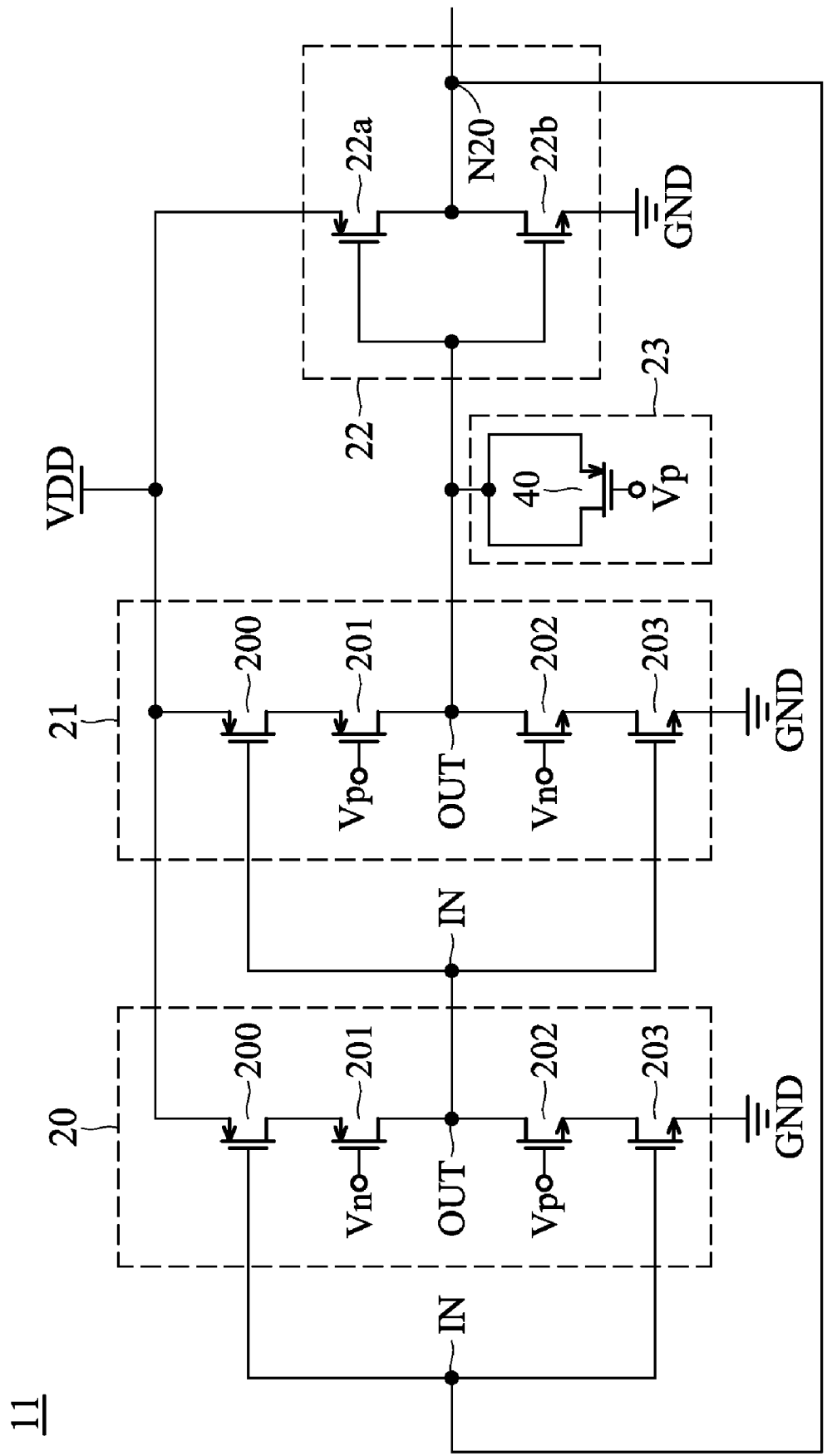
FIG. 4 shows another exemplary embodiment of a capacitance unit of the divider in FIG. 2.

FIG. 4 shows another exemplary embodiment of the capacitance unit 23. Referring to FIG. 4, the capacitance unit 23 comprises a PMOS transistor 40. A source terminal and a drain terminal of the PMOS transistor 40 are coupled to the inverter unit 22 and the output terminal OUT of the latch unit 21, and the gate terminal thereof receives the oscillating signal Vp. When the oscillating signal Vp is at the high level while the oscillating signal Vn is at the low level, the PMOS transistor 201 and the NMOS transistor 202 of the latch unit 21 are turned off, and the voltage Vout of the latch unit 21 is charged through the parasitic gate-to-source capacitance (Vgs) of the PMOS transistor 40 to be over 1.2V (VDD) due to feed-through effect. The signal phase noise L{Δw} of the divider 11 is lowered as the voltage Vout of the latch unit 21 is raised. Thus, for the signal source device 1, phase noise is improved due to the lowered phase noise of the divider 11.

Figure 5:
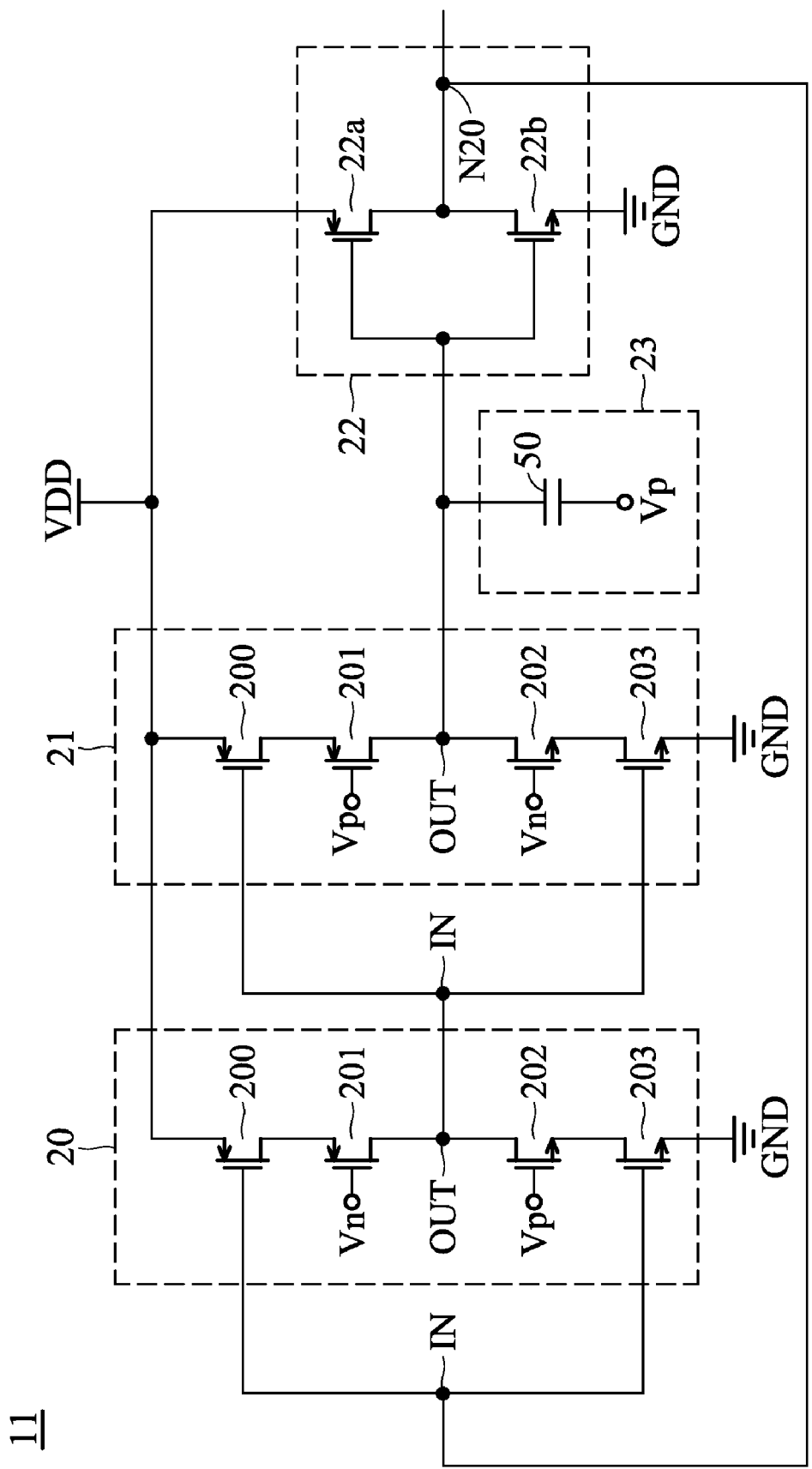
FIG. 5 shows another exemplary embodiment of a capacitance unit of the divider in FIG. 2.

FIG. 5 shows another exemplary embodiment of the capacitance unit 23. Referring to FIG. 5, the capacitance unit 23 comprises a capacitor 50. A first terminal of the capacitor 50 is coupled to the inverter unit 22 and the output terminal OUT of the latch unit 21, and the second terminal thereof receives the oscillating signal Vp. When the oscillating signal Vp is at the high level while the oscillating signal Vn is at the low level, the PMOS transistor 201 and the NMOS transistor 202 of the latch unit 21 are turned off, and the voltage Vout of the latch unit 21 is charged to be over 1.2V (VDD) due to feed-through effect. The signal phase noise L{Δw} of the divider 11 is lowered as the voltage Vout of the latch unit 21 is raised. Thus, for the signal source device 1, phase noise is improved due to the lowered phase noise of the divider 11. In the embodiments of FIGS. 1-5, due to the feed-through effect resulting from the added voltage-shifting unit 23, the signal phase noise of the signal source device 1 is lowered by 6 dB.

Figure 6:
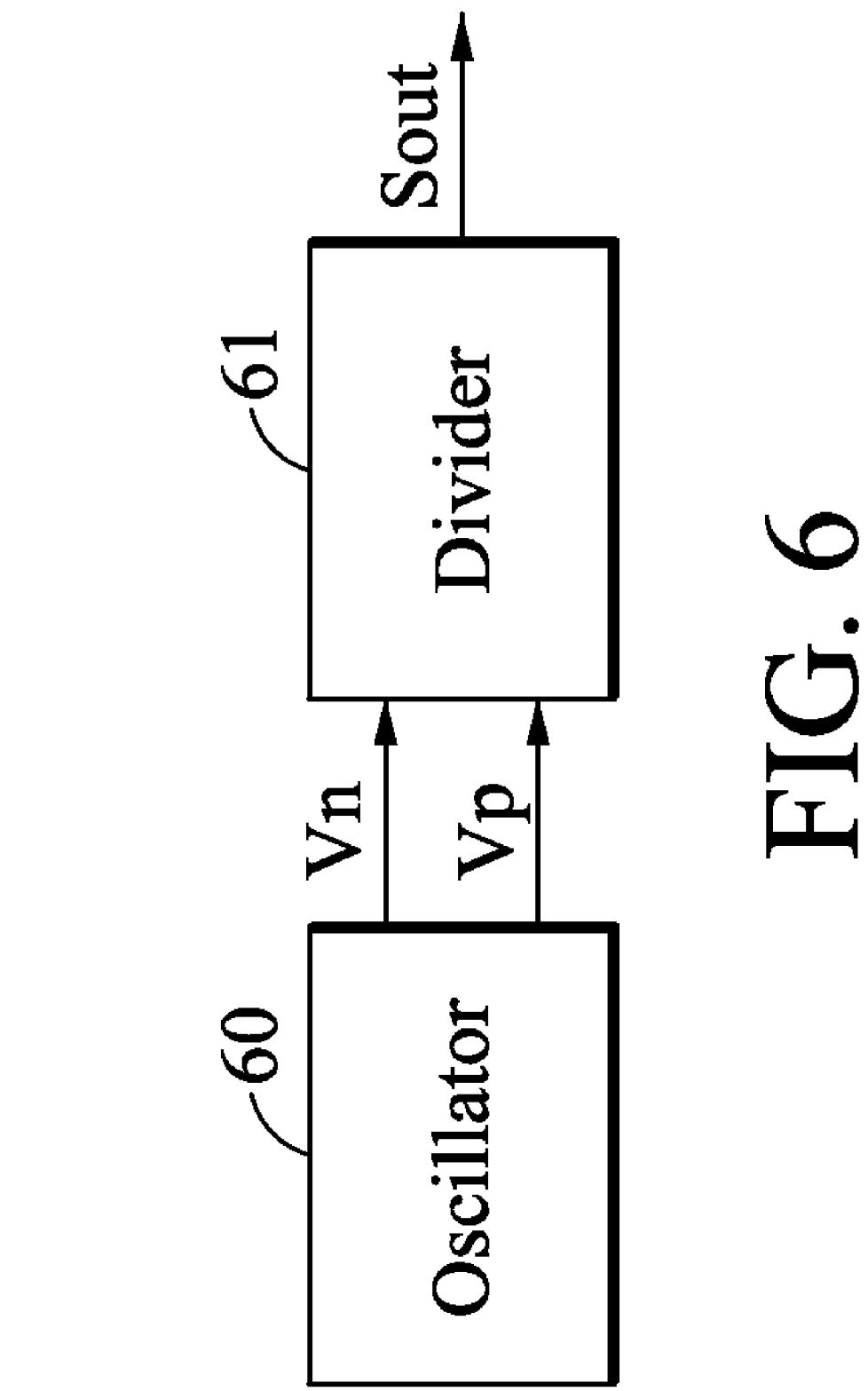
FIG. 6 is a schematic view showing another signal source device in a 900 MHz GSM transceiver.
Figure 7:
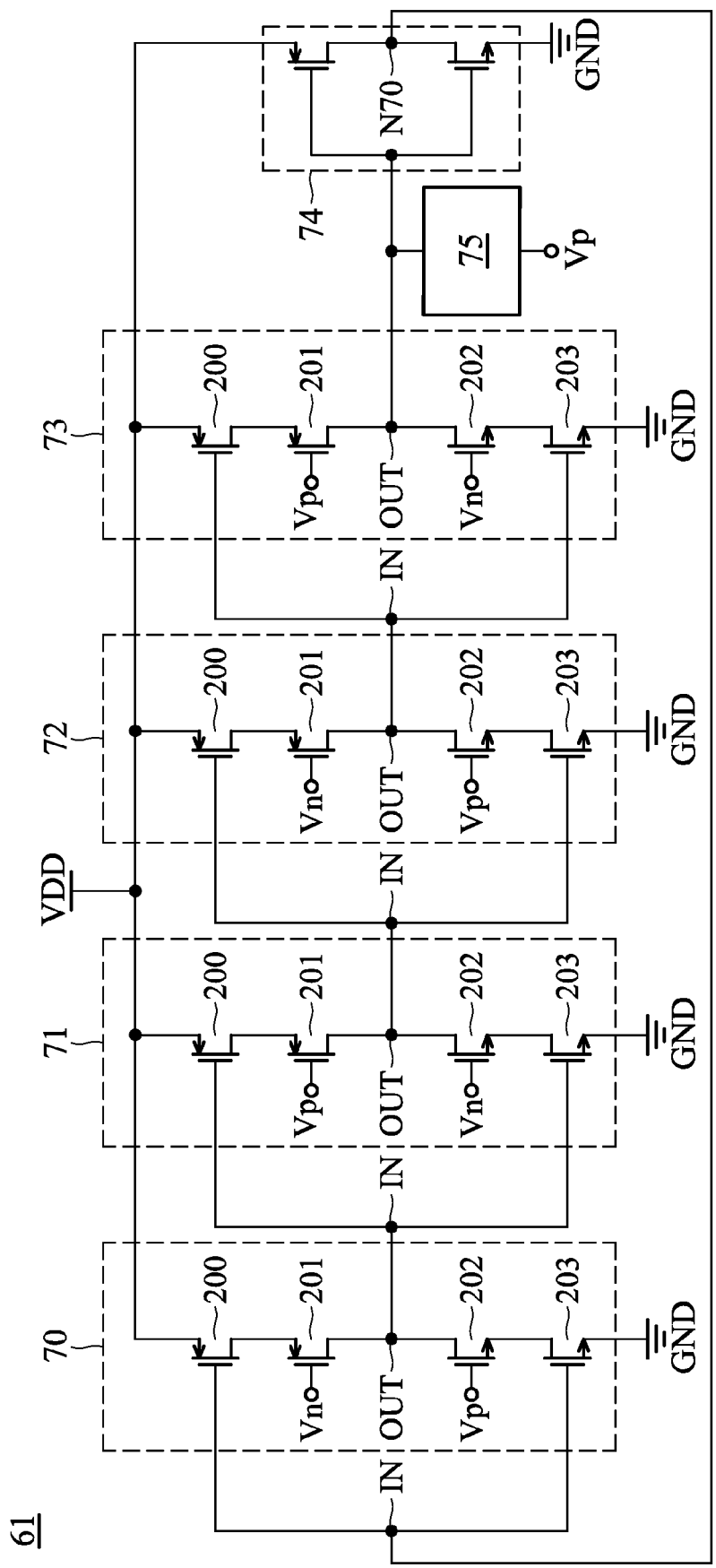
FIG. 7 shows another exemplary embodiment of a divider.

According to the embodiments of FIG. 1-5, two dividers 11 and 12 are given as an example. The two oscillating signals Vn and Vp with 3.6 GHz generated from the oscillator 10 is divided by 2 through the divider 11 to generate the divided signal DS1 with 1.8 GHz. Then, the divided signal DS1 with 1.8 GHz is divided by 2 through the divider 12 to generate the divided signal DS2 with 900 MHz to serve as the output signal Sout with 900 MHz. In some embodiments, a signal source device 6 comprises an oscillator 60 and a divider 61. The oscillator 60 performs the same operation as the oscillator 10 of FIG. 1. Differential oscillating signals Vn and Vp with 3.6 GHz generated from the oscillator 60 can be provided to a divider 61 which divides the input signals Vn and Vp with 3.6 GHz by 4 to generate an output signal Sout with 900 MHz, as shown in FIG. 6. Referring to FIG. 7, the divider 61 comprises four-stage latch units 70, 71, 72, and 73, an inverter 74, and a voltage-shifting unit 75. Each of the latch units 70-73 has the same structure as the latch units 20 and 21 of FIG. 2. Note that the gate terminals of the PMOS transistors 201 and the gate terminals of the NMOS transistors 202 in the first-stage latch unit 70 and the third-stage latch unit 72 respectively receive the oscillating signal Vn and the oscillating signal Vp, while the gate terminals of the PMOS transistors 201 and the gate terminals of the NMOS transistors 202 in the second-stage latch unit 71 and the fourth-stage (last-stage) latch unit 73 respectively receive the oscillating signal Vp and the oscillating signal Vn. The inverter unit 74 is coupled to an output terminal OUT of the latch unit 73 and comprises two transistors which are coupled together at the node N70. The inverter unit 74 outputs a divided signal at the node N70 to serve as the output signal Sout of the signal source device 6. The voltage-shifting unit 75 has a first terminal coupled to the inverter unit 74 and the output terminal OUT of the latch unit 73 (the last stage among the latch units 70-73) and a second terminal receiving the oscillating signal Vp, for shifting the voltage level at the output terminal OUT of the latch unit 73 according to the oscillating signal Vp. Referring to FIG. 7, the input terminal IN of the latch unit 70 is coupled to the node N70 for receiving the output signal Sout, and the output terminal OUT thereof is coupled to the input terminal IN of the latch unit 71.

Figure 8:
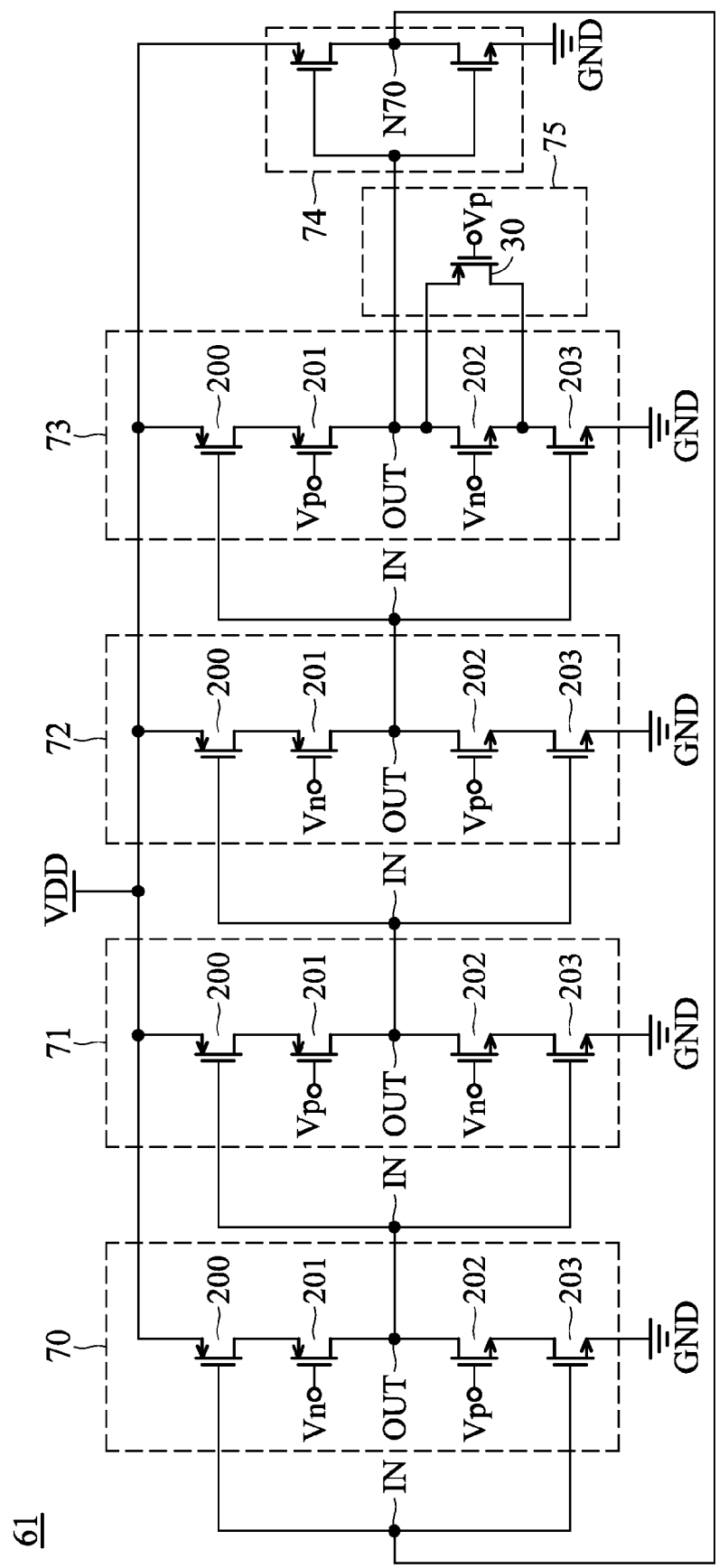
FIG. 8 shows an exemplary embodiment of a capacitance unit of the divider in FIG. 7.
Figure 9:
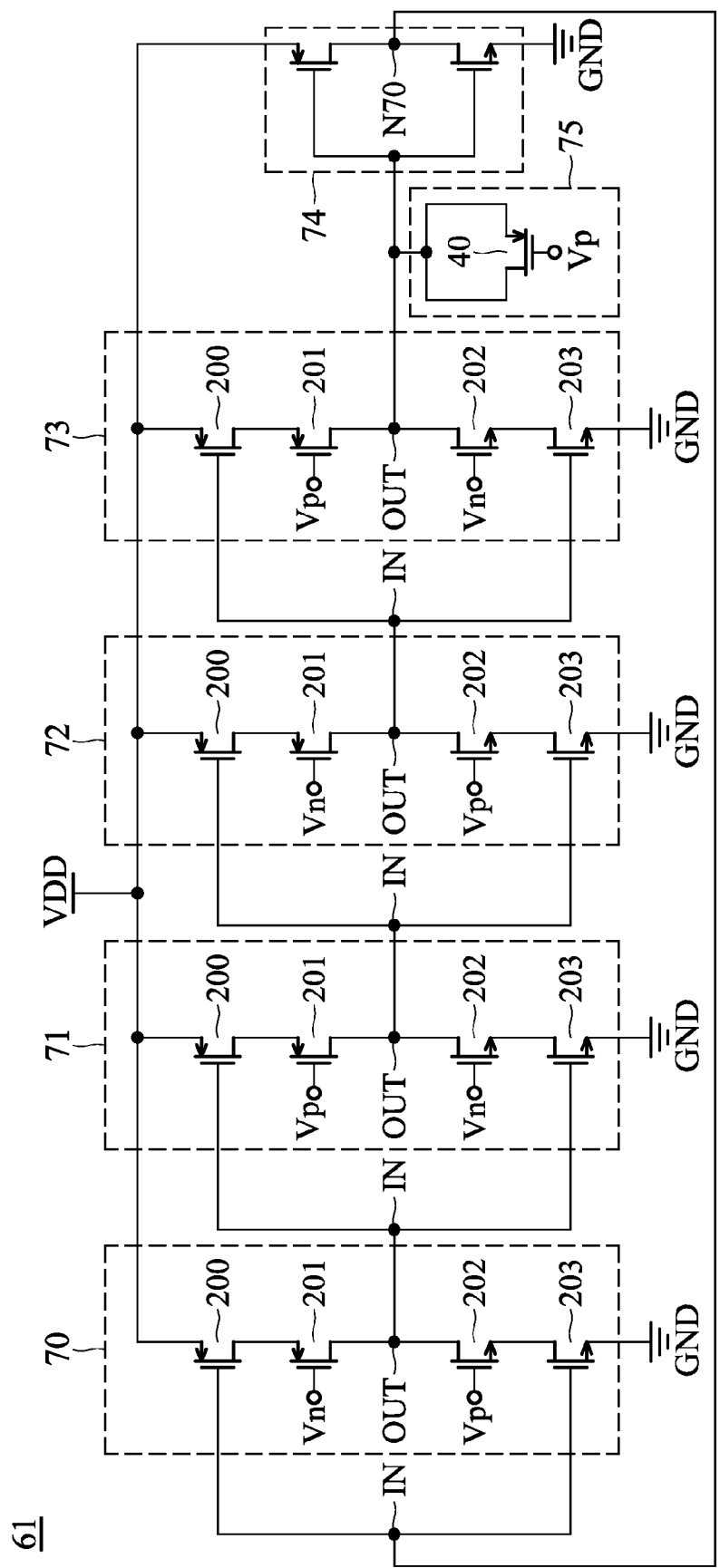
FIG. 9 shows another exemplary embodiment of a capacitance unit of the divider in FIG. 7.
Figure 10:
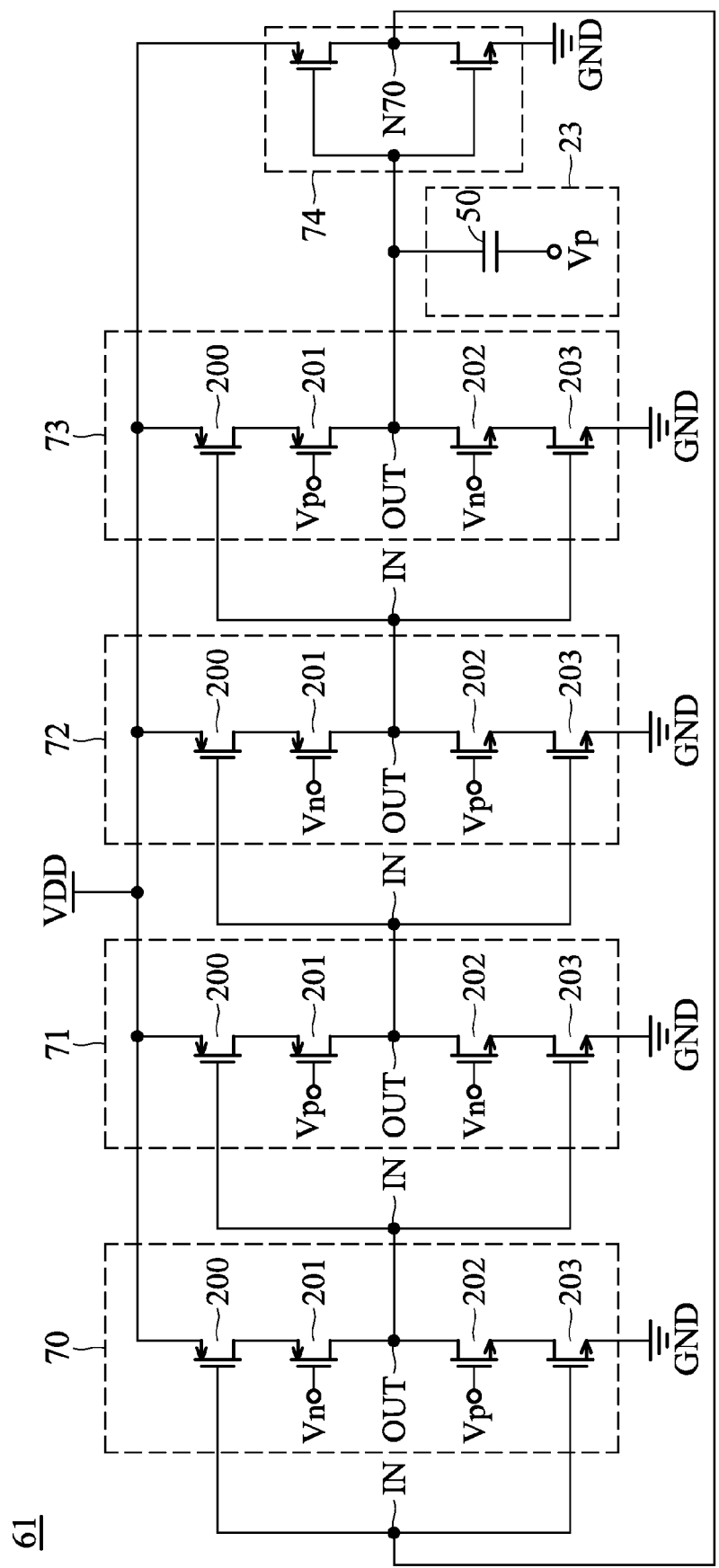
FIG. 10 shows another exemplary embodiment of a capacitance unit of the divider in FIG. 7.

The voltage-shifting unit 75 may comprise a capacitance unit, as mentioned above. The capacitance unit 75 may comprise the PMOS transistor 30 of FIG. 3, the PMOS transistor 40 of FIG. 4, or the capacitor 50 of FIG. 5. Due to feed-through affect of the capacitance unit 75, as shown in FIGS. 8, 9, and 10, when the oscillating signal Vp is at the high level while the oscillating signal Vn is at the low level, the PMOS transistors 201 and the NMOS transistors 202 are turned off, and the voltage Vout of the latch unit 73 is charged to be over 1.2V (VDD) due to feed-through effect. The signal phase noise L{Δw} of the divider 61 is lowered as the voltage Vout of the latch unit 73 is raised. Thus, for the signal source device 6, phase noise is improved due to the lowered phase noise of the divider 61.

In the embodiments of FIGS. 1 and 6, the oscillators 10 and 60 can be implemented by known structures. Moreover, the divider 12 in the embodiment of FIG. 1 receives the divided signal DS1 and outputs the divided signal DS2 to serve as the output signal Sout. Thus, the divider 12 is implemented using a single-in-single-output divider known by those skilled in the art, for example, a true-single-phase-clock (TSPC) divider whose waveforms can reach rail-to-rail swings and thereby good phase noise performance and low noise floor are achieved. Referring to FIGS. 2 and 7, the structures of the latch units are given as examples, without limitation. The structures of the latch units in the above embodiments can be designed as the structures known by those skilled in the art.

In conclusion, the phase noise of the signal source device in above embodiments can be improved by frequency-dividing operation of the divider. The voltage-shifting unit added in the divider raises the amplitude of the waveforms at output terminal OUT of the latch unit, further lowering the phase noise and fastening pull-down transition. The charge feed-through technique is utilized to improve the performance while maintaining a simple circuit structure. When the signal source device is applied in a GSM transmitter, the output signal can conform to GSM specifications.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal source device, comprising:
a plurality of latch units coupled in series;
an inverter unit coupled to the latch units; and
a voltage-shifting unit having a first terminal coupled to the inverter unit and one of the latch units and a second terminal receiving a first input signal, for shifting a voltage level at the first terminal according to the first input signal;
wherein the one of the latch units comprises:
a first transistor having a first terminal, a second terminal coupled to the first terminal of the voltage-shifting unit, and a control terminal receiving the first input signal; and
a second transistor having a first terminal coupled to the second terminal of the first transistor, a second terminal, and a control terminal receiving a second input signal.

2. The signal source device as claimed in claim 1, wherein the first terminal of the voltage-shifting unit is coupled to the inverter unit and a last latch unit among the plurality of latch units.

3. The signal source device as claimed in claim 2, wherein each of the plurality of latch units comprises an input terminal and an output terminal, and the first terminal of the voltage-shifting unit is coupled to the inverter unit and the output terminal of the last latch unit among the plurality of latch units.

4. The signal source device as claimed in claim 3, wherein except for the last latch unit among the plurality of latch units, the output terminal of each of the other latch units is coupled to the input terminal of the next latch unit.

5. The signal source device as claimed in claim 1, wherein the voltage-shifting unit comprises a capacitance unit.

6. The signal source device as claimed in claim 5, wherein the capacitance unit comprises a third transistor having a first terminal coupled to the inverter unit and the one of the latch units, a second terminal, and a control terminal receiving the first input signal.

7. The signal source device as claimed in claim 6,
wherein the second input signal and the first input signal form a differential pair; and
wherein the first and second terminals of the third transistor are coupled to the first and second terminals of the second transistor respectively.

8. The signal source device as claimed in claim 5, wherein the capacitance unit comprises a third transistor having a first terminal coupled to the inverter unit and the one of the latch units, a second terminal coupled to the first terminal of the third transistor, and a control terminal receiving the first input signal.

9. The signal source device as claimed in claim 5, wherein the capacitance unit comprises a capacitor having a first terminal coupled to the inverter unit and the one of the latch units and a second terminal receiving the first input signal.

10. A signal source device for generating an output signal comprising:
   an oscillator for generating a first oscillating signal and a second oscillating signal; and
   a first divider for receiving the first and second oscillating signals and generating a first divided signal, wherein the first divider comprises:
      a plurality of latch units coupled in series, each receiving the first oscillating signal and the second oscillating signal;
      an inverter unit coupled to the latch units and outputting the first divided signal; and
      a voltage-shifting unit having a first terminal coupled to the inverter unit and one of the latch units and a second terminal receiving the first oscillating signal, for shifting a voltage level at the first terminal according to the first oscillating signal;
      wherein the output signal corresponds to the first divided signal; and
      wherein the one of the latch units comprises:
         a first transistor having a first terminal, a second terminal, and a control terminal receiving the first oscillating signal; and
         a second transistor having a first terminal coupled to the second terminal of the first transistor, a second terminal, and a control terminal receiving the second oscillating signal.

11. The signal source device as claimed in claim 10, wherein the first terminal of the voltage-shifting unit is coupled to the inverter unit and a last latch unit among the plurality of latch units.

12. The signal source device as claimed in claim 11, wherein each of the plurality of latch units comprises an input terminal and an output terminal, and the first terminal of the voltage-shifting unit is coupled to the inverter unit and the output terminal of the last latch unit among the plurality of latch units.

13. The signal source device as claimed in claim 10, wherein the voltage-shifting unit comprises a capacitance unit.

14. The signal source device as claimed in claim 13, wherein the capacitance unit comprises a third transistor having a first terminal coupled to the inverter unit and the one of the latch units, a second terminal, and a control terminal receiving the first oscillating signal.

15. The signal source device as claimed in claim 14, wherein the first and second terminals of the third transistor are coupled to the first and second terminals of the second transistor respectively.

16. The signal source device as claimed in claim 13, wherein the capacitance unit comprises a third transistor having a first terminal coupled to the inverter unit and the one of the latch units, a second terminal coupled to the first terminal of the third transistor, and a control terminal receiving the first oscillating signal.

17. The signal source device as claimed in claim 13, wherein the capacitance unit comprises a capacitor having a first terminal coupled to the inverter unit and the one of the latch units and a second terminal receiving the first oscillating signal.

18. The signal source device as claimed in claim 10, wherein the plurality of the latch units comprises two latch units.

19. The signal source device as claimed in claim 18 further comprising a second divider receiving and dividing the first divided signal and generating a second divided signal to serve as the output signal.

20. The signal source device as claimed in claim 10, wherein the plurality of the latch units comprises four latch units, and the first divided signal serves as the output signal.

* * * * *